United States Patent [19]

Joshi et al.

[11] 4,179,802
[45] Dec. 25, 1979

[54] STUDDED CHIP ATTACHMENT PROCESS

[75] Inventors: Kailash C. Joshi, Endwell; Ronald N. Spaight, Vestal, both of N.Y.

[73] Assignee: International Business Machines Corporation, Armonk, N.Y.

[21] Appl. No.: 890,445

[22] Filed: Mar. 27, 1978

[51] Int. Cl.² .............................................. H05K 3/34
[52] U.S. Cl. ...................................... 29/628; 29/626; 228/254; 228/180 A; 29/589
[58] Field of Search ................. 29/589, 590, 591, 626, 29/628; 228/249, 245, 254, 180 A; 204/15

[56] References Cited

U.S. PATENT DOCUMENTS

| | | | |
|---|---|---|---|
| 3,330,026 | 7/1967 | Best et al. ............................. | 29/589 |
| 3,373,481 | 3/1968 | Lins et al. ........................... | 29/589 X |
| 3,403,438 | 10/1968 | Best et al. ...................... | 228/180 A X |
| 3,591,839 | 7/1971 | Evans ...................................... | 29/591 |
| 3,816,270 | 6/1974 | Kniepkamp ............................. | 204/15 |
| 3,901,770 | 8/1975 | Littwin .................................. | 204/15 |

*Primary Examiner*—Francis S. Husar
*Assistant Examiner*—C. J. Arbes
*Attorney, Agent, or Firm*—Cyril A. Krenzer

[57] ABSTRACT

A plurality of metal studs are plated on a chip carrier surface in a pattern to match a terminal metal footprint on a chip to be joined. The studs are of sufficient height to permit flux cleaning, if necessary. After the studs are in place, the chip is aligned with the carrier and attached thereto, the chip pads containing a small amount of solder to provide the connecting joints. The carrier and chip are made of materials having nearly equal thermal expansion characteristics.

8 Claims, 2 Drawing Figures

STUDDED CHIP ATTACHMENT PROCESS

BACKGROUND OF THE INVENTION

1. Field of the Invention

This invention relates generally to circuit interconnection techniques, and more particularly to an improved method for connecting integrated circuit chips to a carrier, especially large integrated circuit assemblies that experience excessive temperature excursions during operation.

REFERENCE TO COPENDING APPLICATION

Reference is made herein to copending application Ser. No. 848,955, filed Nov. 7, 1977 entitled "Method of Manufacturing Printed Circuit Boards", assigned to the assignee of the present application.

PRIOR ART

The advent of large scale integrated circuit (LSI) technologies is continually putting increased demands on chip attachment techniques. This is further complicated as the integration level increases, thereby increasing chip input/output requirements and elevating the overall chip size and power dissipation of the package as well. In addition many applications experience large temperature excursions, therefore requiring a substrate that closely matches the thermal expansion characteristics of the device. The Josephson technology is an example where matched expansion carriers (MEC) and attendant packaging techniques capable of operating at cryogenic temperatures are required. The existing and evolving LSI, and the contemplated Josephson requirements can be advanced using a matched expansion carrier technology for chip and module packaging.

A current chip attachment method used has a requirement for positioning solder balls on the base of an integrated circuit chip, the solder ball then eventually being reflowed after the chip is positioned on a carrier, with the solder ball providing the interconnection between the chip and the carrier. While this process has been quite advantageous for prior integrated circuit technologies, because of the small chip size, thermal limitations and the reworkability of such a packaging technique, its future applications become limited. In addition, the use of such a technology with a chip and carrier which do not have matched expansion characteristics, places significant stresses on the solder ball interconnections as temperature cycling occurs, thereby diminishing the overall reliability of the package. Such a solder ball technology is illustrated in U.S. Pat. No. 3,577,037 and more particularly in FIG. 9. Also, such a technology is illustrated in FIG. 2 of U.S. Pat. No. 3,827,918.

Yet another method for fabricating connector components is illustrated in U.S. Pat. No. 3,292,240. As shown in FIG. 3, the substrate or carrier includes suitable circuitization on the surface thereof connected to the underside of the pins that will form the ultimate connections. Subsequently, a chip device is joined to a metallic coated strip on the substrate. However, in order to accomplish this, suitably builtup contacts which are illustrated as being spherical in form are required. As with the previously described solder ball technology, these spherical balls may utilize a substantial amount of space and further, the attachment technique requires the impressing of the spherical ball into the patterned areas on the top of the substrate.

OBJECTS AND SUMMARY OF THE INVENTION

Accordingly, it is a principal object of the present invention to provide an improved chip/carrier attachment technique which overcomes the foregoing disadvantages of the prior art.

A more specific object of the invention is to provide a matched expansion chip/carrier attachment technique having improved reliability and reworkability.

Yet another object of the invention is to provide an improved chip/carrier attachment technique which improves the thermal characteristics of the interconnections.

Still another object of the present invention is to provide an improved chip/carrier attachment technique which maintains the desired input/output density requirements.

Yet another object of the present invention is to provide a chip/carrier attachment technique with improved input/output characteristics from the chip to the carrier.

The foregoing and other objects and advantages are accomplished according to one aspect of the invention wherein a metal stud is evaporated, plated or sputtered onto the chip carrier surface in a pattern to match a terminal metal footprint on a chip to be joined. The stud must provide a solderable surface for the chip pad, must be electrically conductive to interconnect the chip and carrier and must be thermally conductive to carry heat generated on the chip away. In addition, it must be of sufficient height to allow flux cleaning if necessary. After the studs are in place, the chip is aligned and attached, the chip pads containing only a small amount of solder to provide the joint. The solder volume must only be sufficient to compensate for any planar disparities in the chip and module. Alternatively, the studs can be formed on the chip and the pads with a limited amount of solder are formed on the carrier, thus attaining the same results.

DESCRIPTION OF THE PREFERRED EMBODIMENTS

For a better understanding of the present invention together with other and further objects and advantages thereof, reference is made to the following detailed description taken in conjunction with the above described drawings.

Figure 1:
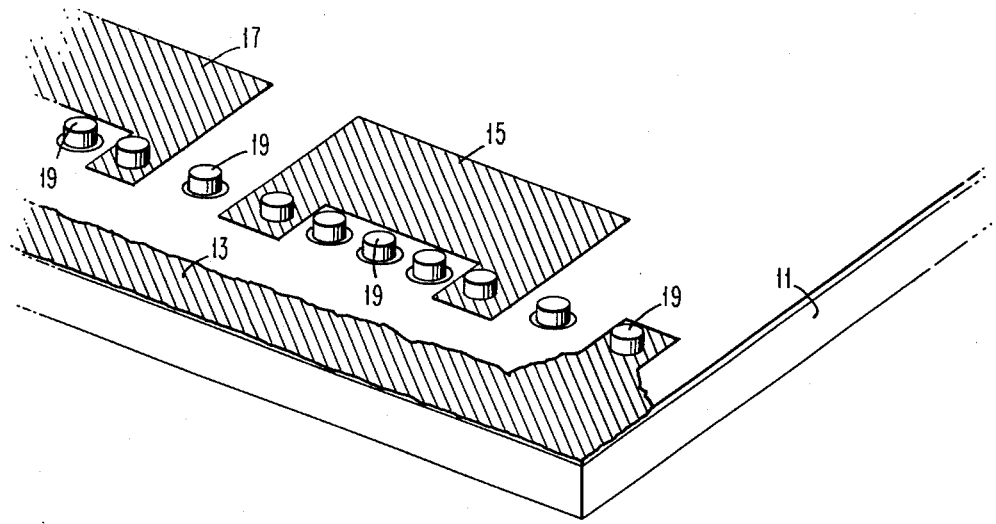
FIG. 1 is an exploded perspective view of a portion of a substrate including the studs thereon to be joined to the chip footprints.

Referring first to FIG. 1 there is shown the carrier portion of a completed assembly including a silicon matched expansion carrier for silicon devices 11 on which are formatted the basic conductive patterns 13, 15 and 17. The matched expansion carrier material could include (but is not limited to) silicon dioxide or polyimides. Typically, the conductive patterns would be made of copper using standard metal deposit and etch techniques. After the conductive patterns are provided on the surface of the silicon material 11, a plurality of studs 19 are formed on the surface in a pattern that matches the terminal metal footprint of the chip to be joined to the substrate. In a preferred embodiment, the copper studs on the silicon carrier 11 are formed by electroplating copper of an appropriate height through a suitable mask. A typical stud height would be between $8-12 \times 10^{-3}$ centimeters with a diameter of $6-9 \times 10^{-3}$ centimeters. After the studs have been appropriately formed, the mask would be removed and the carrier is ready to accept the chips.

Figure 2:
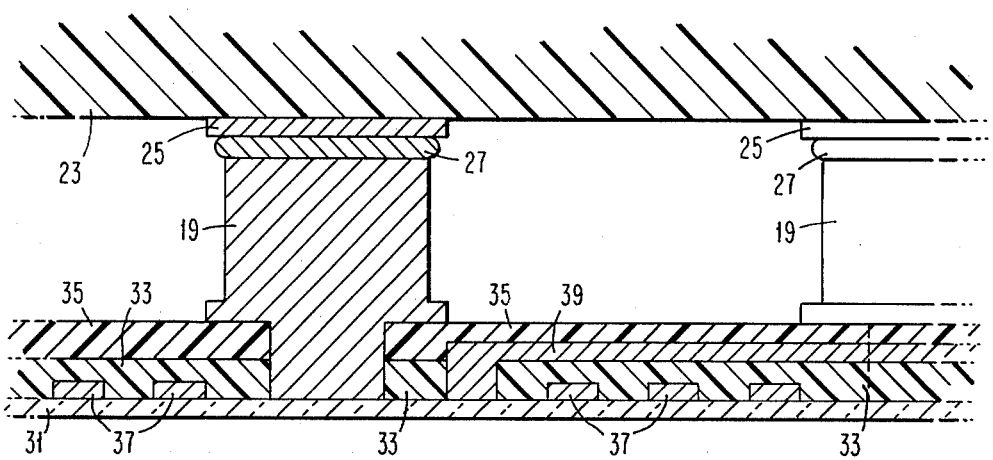
FIG. 2 is an elevation view of the circuit substrate, lines, stud and chip joined thereto illustrating the connection of the stud from the substrate to the chip.

The attachment of the chips to the carrier is illustrated in FIG. 2. The chip 23 includes a plurality of metal pads 25 which are to be joined to corresponding studs 19 on the silicon substrate. The pads 25 may be metal pads formed on the underside of the chip 23. Between the pads 25 and the copper studs 19 there is a very small amount of solder 27 used to complete the bond between the studs and the pad. The solder is only necessary to provide the connection and to provide any slight planar disparities between the chip and the substrate, so that the thickness of the solder would in all likelihood be less than or equal to $4 \times 10^{-3}$ centimeters.

Using the foregoing techniques, there is less height required between the chip and the substrate and with less solder being required, the thermal conductivity is significantly increased. This gain may be as much as 50% or more of a reduction in the thermal resistance between the chip and the substrate.

The carrier substrate may be of a single or multilayer configuration. In a single layer configuration as illustrated in FIG. 1 the conductive patterns 13, 15 and 17 are generated on the substrate surface. In a multilayer configuration the substrate contains a plurality of inner layers. For example, as shown in FIG. 2, the substrate includes first and second layers 33, 35 which encompass an X wiring plane 37 and a Y wiring plane 39, respectively. These are basically electrically conductive inner-planes enclosed in suitable dielectric material, e.g. polyimide or quartz, sequentially disposited in a metal deposit and etch process to form the desired interconnections. In addition the multilayer package could include one or more signal and ground planes.

In the course of processing chips for such a matched expansion carrier package, the chips would be processed as normal up through the metal application (before the solder evaporation). Next, the terminal areas 25 would be tinned with the appropriate solder, forming the so-called terminal metal footprint on the chip. The copper studs 19 of appropriate height are plated on the silicon carrier 31 in a pattern to correspond to the thermal metal footprints found on the chip 23. Thereafter the chip is aligned with studs on the carrier and solder reflow is effected to join the two together.

One method of forming the studs on the substrate (or chip) is to first provide a flash coat of conductive metal (e.g. copper) on the surface thereof. Next the stud pattern is formed using a conventional photoresist which is appropriately exposed and developed, thereby defining stud patterns on the surface. Then the copper studs are additively plated on the exposed flash coat in the areas defined by the photoresist, following which the photoresist is removed and the surface of the substrate (or chip) is flash etched to remove the remaining flash coat. This is similar to the additive plating process described in copending application Ser. No. 848,955, filed Nov. 7, 1977 and assigned to the assignee of the present invention. Of course, the studs could be formed using any other acceptable plating process including sputtering through a molybdenum mask or using standard additive or subtractive processing. When using an additive plating process, it may be necessary to agitate the plating solution (e.g. by ultrasonic agitation) to insure a full strength solution in the defined stud areas.

In particular applications, such as in the Josephson technology, chip attachment requires a fluxless joining at a temperature below 60° centigrade. The stud attachment technique of the present invention is particularly suited for such applications since the stud can readily be used to attain metallurgical joints by use of slight pressure without flux at relatively low temperatures. Appropriate metals can be utilized in the stud and solder compositions to provide the necessary superconductivity for these interconnections.

In utilizing the concept according to the present invention, there is a significant thermal performance improvement by reducing the chip attachment path thermal resistance by as much as 50% or more. In addition, it is possible to replace used chips using this technology and to allow potentially higher input/output density at the chip due to the smaller physical size of the stud as compared to the prior art solder ball interconnection technique. Furthermore, the low temperature fluxless joining of chips for advanced applications such as Josephson technology is feasible with the present invention.

Furthermore, the inherent reliability of these interconnections is very high since both sides expand almost equally during thermal cycle in use. Therefore, large device chips can be joined without compromising the overall package reliability. For the same reasons many chips can be attached to the same field replaceable unit or module with excellent reworkability of defective units.

While the present invention has been described in the context of the preferred embodiment thereof, it will be readily apparent to those skilled in the art that other modifications and variations can be made therein without departing from the spirit or scope of the invention. Accordingly, it is not intended that the invention be limited to the specifics of the foregoing description of the preferred embodiment, but rather as to embrace the full scope of the following claims.

We claim new, and desire to secure by Letters Patent is:

1. A method of bonding a first integrated circuit device having a number of connecting points to a second integrated circuit device having a like number of connecting pads, both first and second devices having approximately equal thermal expansion characteristics, said method comprising the steps of:
    fabricating a metal stud at each of said connecting points of said first integrated circuit device, the top of each stud providing a bondable surface;
    applying a amount of solder not exceeding $4 \times 10^{-3}$ centimeters thick to each of said connecting pads of said second integrated circuit devices;
    aligning said first and second integrated circuit devices so that each metal stud of said first device is positioned proximate its respective connecting pad of said second device; and
    applying sufficient pressure and temperature to the studs and pads to bond each of said studs to its respective connecting pad.

2. The invention according to claim 1 including fabricating said first and second integrated circuit devices as a circuitized semiconductor chip and a matched expansion chip carrier substrate, respectively.

3. The invention according to claim 1 including fabricating said first and second integrated circuit devices as a matched expansion chip carrier substrate and a circuitized semiconductor chip, respectively.

4. The invention according to claims 2 or 3 including both first and second integrated circuit devices from a silicon base.

5. The invention according to claim 1 including forming said studs of the metal copper.

6. The invention according to claim 5 wherein said copper studs are fabricated by the steps of:
depositing a thin layer of conductive metal over the areas encompassing the positions for each of said studs on the surface of said first device;
depositing a layer of photoresist over the surface of said first device;
exposing and developing the photoresist to define the stud areas on the surface of said first device;
electroplating copper in the stud areas defined in said photoresist to form said studs;
removing the photoresist; and flash etching the surface of said first device to remove the exposed thin layer of conductive metal therefrom.

7. The invention according to claim 1 inducing fabricating said metal studs by evaporating metal through openings in a pattern placed over the surface of said first device, said openings corresponding to the stud locations on the surface of said device.

8. The invention according to claim 6 including fabricating said studs to cylindrical shape having a height of 8 to $12 \times 10^{-3}$ centimeters and a diameter of 6 to $9 \times 10^{-3}$ centimeters.

* * * * *